United States Patent
McNeill et al.

(10) Patent No.: US 9,281,833 B2
(45) Date of Patent: Mar. 8, 2016

(54) ANALOG-TO-DIGITAL CONVERTER WITH POWER SUPPLY-BASED REFERENCE

(75) Inventors: Bruce Walter McNeill, Yokohama (JP); Peter John Windler, Fort Collins, CO (US); Wei T. Lim, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 955 days.

(21) Appl. No.: 13/481,909

(22) Filed: May 28, 2012

(65) Prior Publication Data

US 2013/0314110 A1    Nov. 28, 2013

(51) Int. Cl.
- *G01R 27/08* (2006.01)
- *H03M 1/06* (2006.01)
- *G01K 7/24* (2006.01)
- *H03M 1/12* (2006.01)

(52) U.S. Cl.
CPC ............ *H03M 1/0619* (2013.01); *G01K 7/24* (2013.01); *G01K 2219/00* (2013.01); *H03M 1/12* (2013.01)

(58) Field of Classification Search
CPC ....... G01R 27/14; G01R 17/105; H01C 10/00
USPC ................. 324/705, 600, 691, 713, 714, 723
See application file for complete search history.

(56) References Cited

U.S. PATENT DOCUMENTS

| | | | | |
|---|---|---|---|---|
| 4,755,958 A | * | 7/1988 | Mizuhara | 702/133 |
| 5,116,136 A | * | 5/1992 | Newman et al. | 374/102 |
| 5,119,347 A | * | 6/1992 | Portmann | 368/113 |
| 5,165,272 A | * | 11/1992 | Kleinhans | H03H 11/24 324/128 |
| 5,738,441 A | * | 4/1998 | Cambridge et al. | 374/102 |
| 5,873,046 A | * | 2/1999 | Bronner | H04B 1/406 455/226.2 |
| 6,809,531 B2 | * | 10/2004 | Slye et al. | 324/714 |
| 7,550,981 B2 | * | 6/2009 | Merry | G01D 5/165 324/525 |
| 7,719,402 B2 | * | 5/2010 | Ruettiger | 338/160 |
| 7,982,473 B2 | * | 7/2011 | Virtanen | G01D 3/08 324/699 |
| 2003/0094501 A1 | * | 5/2003 | Rymer | A01M 1/2038 239/6 |
| 2004/0196168 A1 | * | 10/2004 | Ho | H03M 3/496 341/108 |
| 2010/0145640 A1 | * | 6/2010 | Aguinaga et al. | 702/57 |
| 2011/0012771 A1 | * | 1/2011 | Van Der Ploeg | H03M 1/361 341/159 |
| 2015/0285691 A1 | * | 10/2015 | Caffee | G01K 7/24 374/184 |

OTHER PUBLICATIONS

Oljaca et al., How the Voltage Reference Affects ADC Performance, Part 2, Analog Applications Journal, 3Q 2009, pp. 13-16, Texas Instruments, Dallas, Texas.
3.3 V Supply, Voltage Output Temperature Sensor with Signal Conditioning, AD22103, Analog Devices, Inc., 1995, pp. 1-6, Norwood, MA, [online] Available at: http://www.analog.com/en/mems-sensors/digital-temperature-sensors/ad22103/products/product.html.
Wu et al. A 80kS/s 36μW Resistor-Based Temperature Sensor Using BGR-Free SAR ADC with a Unevenly-Weighted Resistor String in 0.18 μm CMOS, VLSI Circuits (VLSIC), Symposium, Jun. 2011, pp. 222-223, Honolulu, HI.

* cited by examiner

*Primary Examiner* — Tung X Nguyen
*Assistant Examiner* — Giovanni Astacio-Oquendo

(57) ABSTRACT

A measurement circuit is provided for measuring the resistance of a variable resistance element biased with an external voltage supply. The measurement circuit includes an analog-to-digital converter (ADC) and a reference generator connected with the ADC. The ADC is operative to receive a reference voltage and a first voltage developed across the variable resistance element, and to generate a digital output signal indicative of a relationship between the first voltage and the reference voltage. The reference generator is operative to generate the reference voltage as a function of the external voltage supply.

20 Claims, 4 Drawing Sheets

FIG. 3

| TEMP (°C) | MIN | NOMINAL | MAX |
|---|---|---|---|
| -10 | 2.066 | 2.081 | 2.095 |
| -5 | 1.994 | 2.011 | 2.027 |
| 0 | 1.908 | 1.927 | 1.945 |
| 5 | 1.807 | 1.828 | 1.847 |
| 10 | 1.694 | 1.714 | 1.734 |
| 15 | 1.568 | 1.589 | 1.608 |
| 20 | 1.435 | 1.454 | 1.473 |
| 25 | 1.297 | 1.314 | 1.331 |
| 30 | 1.153 | 1.174 | 1.194 |
| 35 | 1.013 | 1.036 | 1.058 |
| 40 | 0.881 | 0.905 | 0.930 |
| 45 | 0.759 | 0.784 | 0.809 |
| 50 | 0.649 | 0.674 | 0.700 |
| 55 | 0.552 | 0.577 | 0.601 |
| 60 | 0.467 | 0.491 | 0.515 |
| 65 | 0.395 | 0.417 | 0.439 |
| 70 | 0.333 | 0.353 | 0.374 |
| 75 | 0.280 | 0.299 | 0.318 |
| 80 | 0.236 | 0.253 | 0.271 |
| 85 | 0.199 | 0.215 | 0.231 |
| 90 | 0.168 | 0.182 | 0.197 |

ANALOG-TO-DIGITAL CONVERTER WITH POWER SUPPLY-BASED REFERENCE

BACKGROUND

As electronic circuits and systems are becoming ever more popular in critical applications, including, but not limited to, data storage, electronic vehicles and aeronautics, so do their operating conditions become harsher. This often means using electronic components at or near the limit of their functional parameters and very close to or even exceeding their maximum operating temperature. Accurately monitoring the temperature of these electronic circuits and systems therefore becomes critical to avoiding failures or other reliability issues.

In certain temperature measurement applications, such as, for example, monitoring the temperature of a hard disk drive so as to change temperature-sensitive parameters relating thereto, a thermistor is often placed at the disk drive head. A thermistor is a well-known type of device having a resistance that varies significantly with temperature, more so than in standard resistors. A voltage across the thermistor is measured and a corresponding temperature is obtained (e.g., based on a prescribed relationship between temperature and resistance associated with the device) as a function of the voltage across the thermistor.

There are many sources of error using this standard approach. Two primary sources of error are the variation in the external voltage supply, which is typically used to bias the thermistor, and the accuracy of an internal voltage reference often used for comparison with the thermistor voltage. To reduce these errors, a calibration procedure can be employed, such as during power-up. However, calibration increases circuit complexity and must generally be performed by the user, and is therefore undesirable. Furthermore, because calibration is typically only performed once (e.g., at power-up), such an approach cannot correct errors resulting from variations in temperature or other operating conditions which occur after calibration has completed.

SUMMARY

Embodiments of the invention advantageously provide a novel analog-to-digital converter (ADC) architecture for accurately measuring temperature without a need for calibration of the measurement. To accomplish this, embodiments of the invention utilize an ADC and a reference circuit coupled with the ADC, the reference circuit being biased from the same voltage supply used by the temperature measurement element (e.g., thermistor).

In accordance with an embodiment of the invention, a measurement circuit is provided for measuring the resistance of a variable resistance element biased with an external voltage supply. The measurement circuit includes an analog-to-digital converter (ADC) and a reference generator connected with the ADC. The ADC is operative to receive a reference voltage and a first voltage developed across the variable resistance element, and to generate a digital output signal indicative of a relationship between the first voltage and the reference voltage. The reference generator is operative to generate the reference voltage as a function of the external voltage supply. An integrated circuit incorporating at least one measurement circuit according to embodiments of the invention is also contemplated.

In accordance with another embodiment of the invention, a method for measuring a resistance of a variable resistance element biased with an external voltage supply includes the steps of: receiving a first voltage developed across the variable resistance element; generating a reference voltage as a function of the external voltage supply; obtaining a ratio of the first voltage and the reference voltage; and generating a digital output signal indicative of the ratio of the first voltage and the reference voltage.

Embodiments of the invention will become apparent from the following detailed description, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 3 is a table depicting exemplary voltages across an illustrative thermistor, suitable for use with embodiments of the invention, as a function of temperature;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of illustrative measurement circuits and methods adapted to measure voltages across a thermistor. It should be understood, however, that embodiments of the invention are not limited to these or any other particular method or circuit arrangements. Rather, aspects of the invention are directed more broadly to techniques for accurately measuring the voltage across a variable resistance element in a manner that eliminates a need for calibration of the measurement. Embodiments of the invention have wide use, for example, in temperature measurement and/or monitoring applications, such as, but not limited to, monitoring the temperature of a hard disk drive so as to change one or more temperature-sensitive parameters related thereto. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Figure 1:
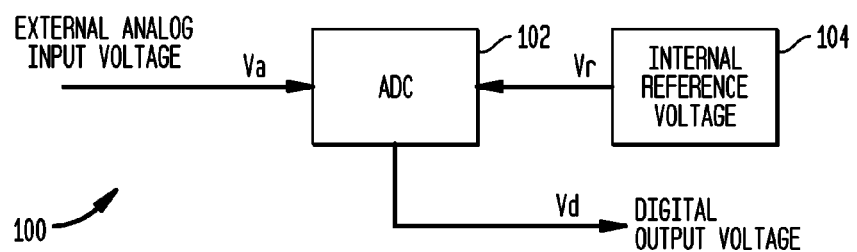
FIG. 1 is a block diagram depicting at least a portion of an illustrative measurement circuit, which can be modified to incorporate techniques according to embodiments of the invention.

As previously stated, a standard approach for monitoring the temperature of an electronic circuit or system is to measure the voltage across a thermistor, or alternative variable resistance element. FIG. 1 is a block diagram depicting at least a portion of an illustrative measurement circuit 100, which can be modified to incorporate techniques according to embodiments of the invention. As apparent from FIG. 1, the measurement circuit 100 includes an analog-to-digital converter (ADC) 102 and an internal reference generator 104 coupled with the ADC. Fundamentally, an external analog voltage, Va, which represents a voltage to be measured (e.g., thermistor voltage), is converted to a digital output value, Vd, indicative thereof by the ADC 102. To accomplish this, the ADC 102 is operative to compare the external analog voltage Va to a known internal reference voltage, Vr, generated by the reference generator 104. The digital output value Vd generated by the ADC 102 essentially represents a ratio of the analog voltage Va to the reference voltage Vr.

The reference generator 104 is traditionally designed to be insensitive to variations in process, supply voltage and/or temperature (PVT). Typically, in conventional ADC arrangements, the reference voltage Vr is generated from a bandgap reference circuit, although alternative reference circuit configurations are similarly contemplated. The accuracy of the local reference voltage is a fundamental limit to the absolute accuracy of the ADC and resulting digital output representation of the measurement. For modern integrated circuit process technologies, an untrimmed reference voltage typically has a tolerance of about ±5 percent (%), and if trimmed, the accuracy can be better than about 1%.

Figure 2:
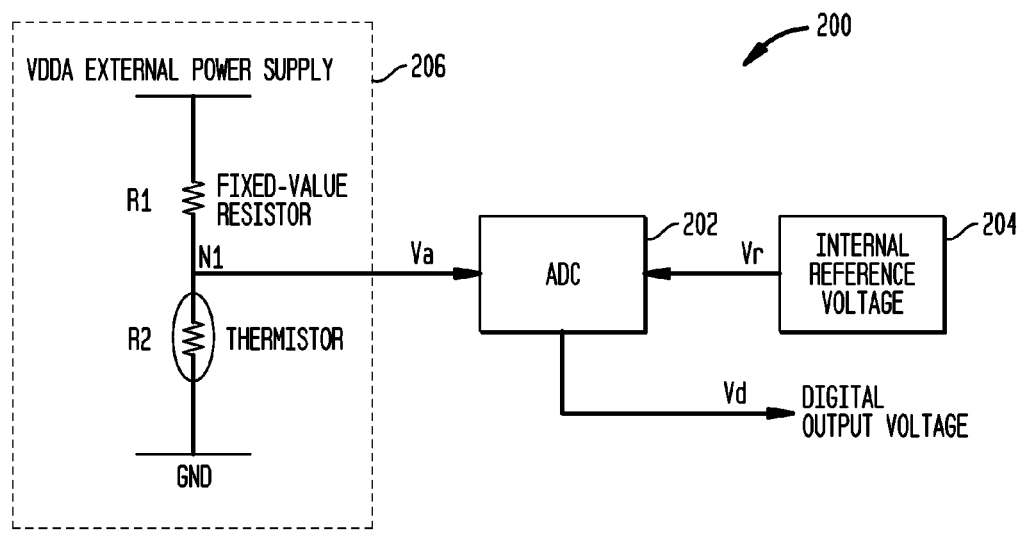
FIG. 2 is a block diagram depicting at least a portion of an illustrative circuit for measuring a voltage across a thermistor, which can be modified to incorporate techniques according to embodiments of the invention.

With reference now to FIG. 2, a block diagram depicts at least a portion of an illustrative measurement circuit 200 for measuring a voltage across an external thermistor, or an alternative variable resistance element, to thereby measure temperature. The measurement circuit 200 includes an ADC 202 and an internal reference generator 204 coupled with the ADC. The ADC 202 is operative to compare an external analog voltage, Va, generated by a circuit 206 to be measured, to a known internal reference voltage, Vr, generated by the reference generator 204. A digital output value, Vd, generated by the ADC 202 essentially represents a ratio of the analog voltage Va to the reference voltage Vr.

In this illustration, the analog voltage Va generated by the circuit 206 represents a voltage developed across a thermistor, R2, biased from a power supply voltage, VDDA, through a fixed resistor, R1, of known value. Specifically, a first terminal of the fixed resistor R1 is adapted for connection with the power supply voltage VDDA, a second terminal of R1 is connected with a first terminal of the thermistor R2 at node N1 and forms an output for generating the analog voltage Va, and a second terminal of R2 is adapted for connection with ground. Fundamentally, the temperature measurement compares the resistance of the thermistor R2, which is designed to vary with temperature, to the resistance of the fixed resistor R1, which is designed to be substantially temperature insensitive.

Figure 4:
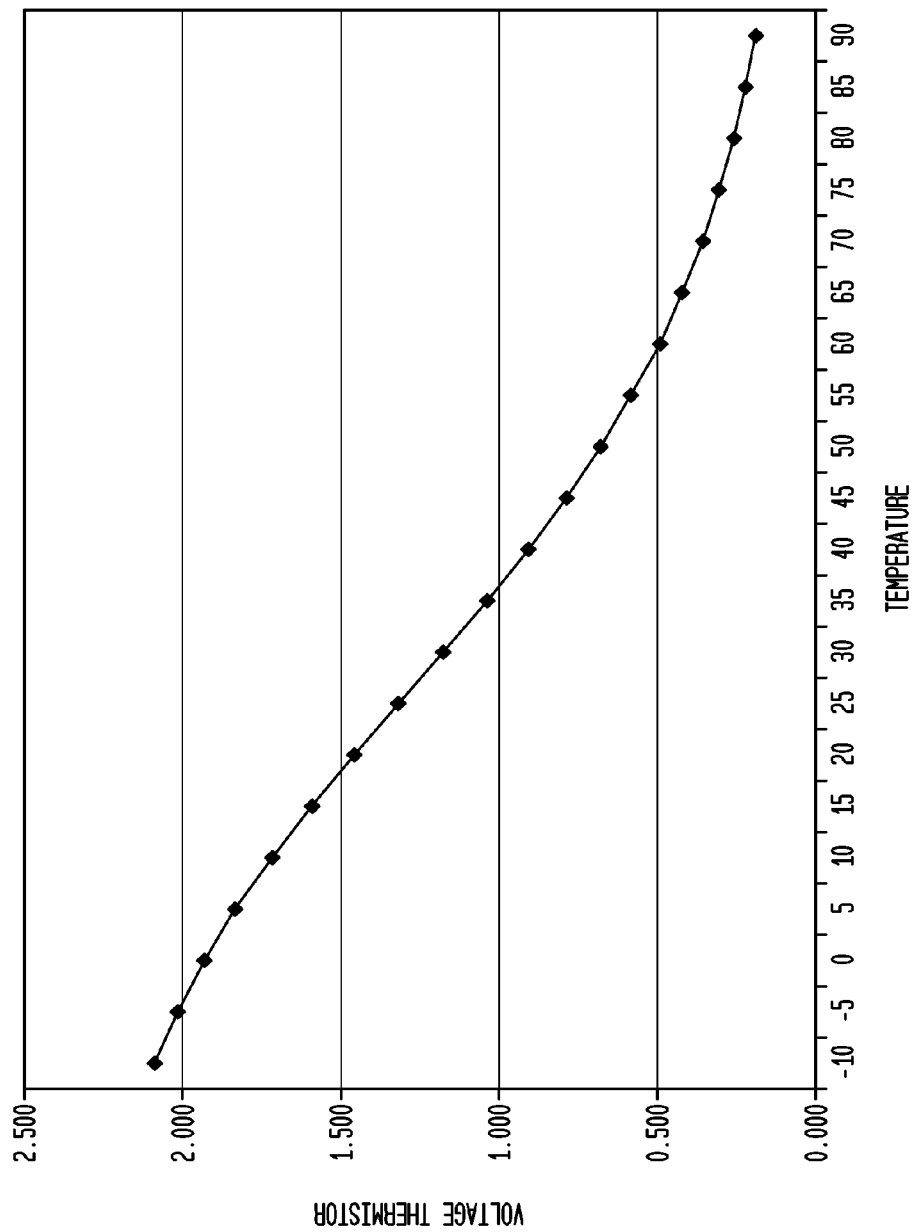
FIG. 4 graphically depicts exemplary nominal voltages across an illustrative thermistor as a function of temperature in accordance with the table shown in FIG. 3.

As previously stated, a thermistor is a well-known type of device which exhibits a resistance that varies significantly with temperature; a temperature coefficient of the thermistor is typically greater than the temperature coefficient associated with a standard resistor. A voltage developed across the thermistor is measured and a corresponding temperature is obtained based on a prescribed relationship between temperature and the measured thermistor voltage. FIG. 3 is a table depicting exemplary voltages developed across an illustrative thermistor, suitable for use with embodiments of the invention, as a function of temperature. The measured voltage across a thermistor will generally vary from a prescribed nominal value due, at least in part, to manufacturing variations in the thermistor. Illustrative minimum, nominal and maximum thermistor voltages are shown in FIG. 3 in increments of five degrees Celsius (° C.) within a temperature range of −10° C. to 90° C. FIG. 4 graphically depicts exemplary nominal voltages across the illustrative thermistor as a function of temperature, in accordance with the table shown in FIG. 3. As apparent from FIGS. 3 and 4, the voltage across the thermistor drops as temperature increases; i.e., the thermistor exhibits a negative temperature coefficient.

Although highly nonlinear, the temperature can be determined from the voltage measured across the thermistor using techniques well known by those skilled in the art. For example, a measured voltage across the thermistor may be translated into a corresponding temperature using interpolation of a prescribed look-up table (e.g., similar to the illustrative table shown in FIG. 3) characterizing the resistance of the thermistor over a given temperature range.

Although thermistors are designed having various tolerances, a typical specification is accurate to within about 1° C. The accuracy of the temperature measurement is most sensitive at low temperatures. By way of illustration only, using the exemplary table shown in FIG. 3, a five percent error in measured voltage at −10° C. translates to a 7° C. error in the temperature measurement. With reference again to FIG. 2, a five percent error in voltage measurement at the ADC 202 can be attributable, for example, to either a five percent error in the reference voltage Vr generated by the local reference generator 204, or a five percent error in the external power supply voltage VDDA, or some combination thereof.

Figure 5:
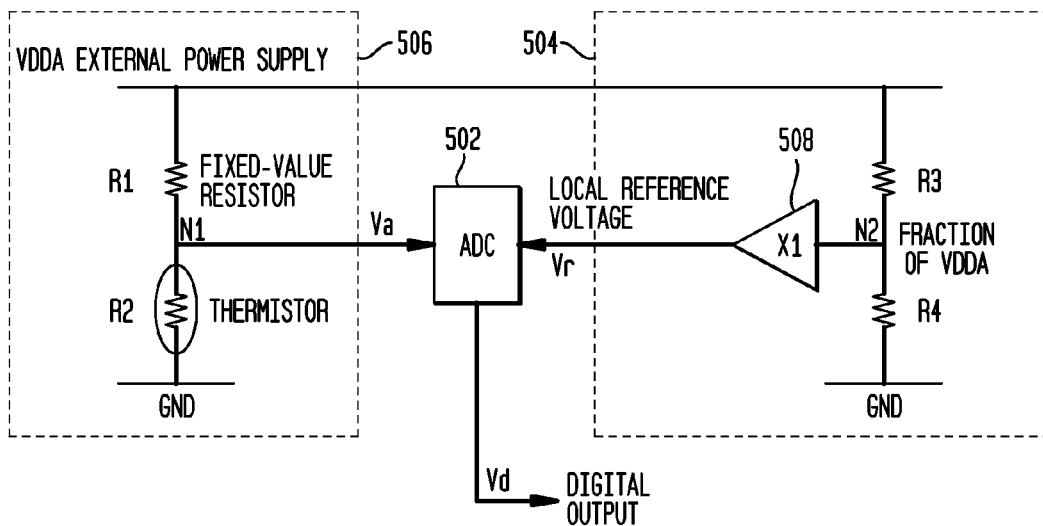
FIG. 5 is a schematic diagram depicting at least a portion of an exemplary circuit for measuring an analog voltage, according to an embodiment of the invention.

FIG. 5 is a schematic diagram depicting at least a portion of an exemplary measurement circuit 500 for measuring an analog voltage, according to an embodiment of the invention. In an illustrative embodiment, the measurement circuit 500 is used for measuring a voltage developed across an external thermistor, or an alternative variable resistance element (e.g., resistance temperature detector (RTD)), to thereby measure temperature. It is to be appreciated, however, that the invention is not limited to this specific application. The measurement circuit 500 includes an ADC 502 and an internal reference generator 504 coupled with the ADC. The ADC 502 is operative to compare an external analog voltage, Va, generated by a circuit 506 to be measured, to a known internal reference voltage, Vr, generated by the reference generator 504. An output signal, Vd, generated by the ADC 502 is a digital representation (e.g., digital word) of a relationship between the measured analog voltage Va and the reference voltage Vr. In one embodiment, the digital output signal Vd comprises a binary code indicative of a ratio of the analog voltage Va and the reference voltage Vr. It is to be understood, however, that the invention is not limited to the digital output signal Vd being a ratio of the analog voltage Va and the reference voltage Vr. Rather, in accordance with alternative embodiments, relationships other than a ratio may be similarly used.

In this illustration, the analog voltage Va generated by the circuit 506 represents a voltage developed across a thermistor, R2, biased from a power supply voltage, VDDA, through a fixed resistor, R1, of known value. Specifically, a first terminal of the resistor R1 is adapted for connection with the power supply voltage VDDA, a second terminal of R1 is connected with a first terminal of the thermistor R2 at node N1 and forms an output for generating the analog voltage Va, and a second terminal of R2 is adapted for connection with ground (GND). Fundamentally, the temperature measurement compares a resistance of the thermistor R2, which is designed to vary with temperature, to a resistance of the fixed resistor R1, which is designed to be substantially temperature insensitive.

In conventional ADC measurement circuit architectures, an internal reference circuit is specifically designed to generate a reference voltage for the ADC which is not only insensitive to temperature and supply voltage variations, but is also independent of the analog voltage supplied to the ADC. In the illustrative embodiment depicted in FIG. 5, assuming the reference voltage Vr is ideally insensitive to variations in the external supply voltage VDDA, any variation in VDDA (and thus in the measured analog voltage Va) will directly translate into a corresponding error in the digital output value Vd generated by the ADC 502. However, according to an embodiment of the invention, the local reference generator 504 is operative to generate the reference voltage Vr as a function of the supply voltage VDDA used to bias the thermistor R2, such as, for example, using a prescribed fraction (e.g., a scaled version) of VDDA. In this regard, embodiments of the invention advantageously utilize a ratiometric measurement approach. In ratiometric measurements, the measured quantity (e.g., voltage) is proportional to a ratio of two or more like quantities (e.g., voltages) rather than to an absolute value of the quantity. When the two voltages are proportional to the same reference (e.g., VDDA), as in the measurement circuit 500, an absolute value of the reference (or variations of the reference) will not affect the ratio. Thus, very precise measurement results are obtained, advantageously without the need for calibration.

By way of example only and without limitation, the reference generator 504 comprises a voltage divider including at least two resistors connected together in series between the external supply voltage VDDA and ground (GND). More particularly, a first terminal of a first resistor, R3, is adapted for connection with VDDA, a second terminal of R3 is connected with a first terminal of a second resistor, R4, at node N2, and a second terminal of R4 is adapted for connection with ground. A voltage, $V_{N2}$, at node N2 will be a function of the external power supply voltage VDDA according to the following expression:

$$V_{N2} = VDDA \cdot \frac{R4}{R3 + R4}$$

Here, it is assumed that resistors R3 and R4 are substantially matched to one another (at least in terms of temperature coefficient), so that variations in the respective resistances of R3 and R4 will effectively cancel one another in the above expression. In this manner, resistor dividers can be made accurately, with about 0.1 percent tolerance being reasonably achievable using modern technologies.

The reference generator 504 further includes an optional buffer 508 having an input coupled with the voltage divider at node N2 and having an output for generating the reference voltage Vr. The buffer 508 is preferably implemented as a unity gain amplifier, such that, ignoring any offset errors introduced by the buffer, the reference voltage Vr will be substantially the same as the voltage $V_{N2}$ at node N2. The invention, however, is not limited to a unity gain amplifier. Rather, in alternative embodiments, the gain of the buffer 508 may be set to something other than unity. Moreover, a second buffer (not explicitly shown) can be optionally included between node N1 and an output of the circuit 506 to be measured. A gain of the second buffer may also be unity, although the invention is not limited to any specific gain for the second buffer. Moreover, in some embodiments, a gain of the second buffer is independent of a gain of the buffer 508; in other embodiments, the gain of the second buffer and the gain of the buffer 508 are appropriately matched to one another. For example, in an illustrative embodiment, the second buffer (not explicitly shown) may be configured having a gain of two, and the gain of buffer 508 is likewise configured having a gain of two.

Variations in the analog voltage Va supplied to the ADC 502 attributable to a change in the supply voltage VDDA will effectively be cancelled by introducing the same variation into the ADC reference voltage Vr. More particularly, with the ADC reference voltage Vr being a function of the external supply voltage VDDA used to bias the thermistor R2, measurement error caused by variations in the supply voltage and/or the local reference voltage are largely eliminated. For example, if VDDA increases by 1%, the voltage across the thermistor Va also increases by 1%, and the local reference voltage Vr supplied to the ADC 502 increases by 1%. Since, in this exemplary embodiment, the ADC digital output Vd is based on a ratio of the two voltages Va and Vr, the digital output representation Vd will remain essentially unchanged.

Although not explicitly shown in FIG. 5, embodiments of the invention contemplate that the two quantities Va and Vr may be first converted to a digital representation before the relationship (e.g., ratio) between Va and Vr is obtained. For example, in other embodiments, the voltage Va is presented to a first input of a first ADC and a reference voltage, which is ideally independent of temperature or supply voltage (e.g., a bandgap reference), is supplied to a second input of the first ADC. A first voltage generated by the first ADC will be a digital representation of a relationship between the voltage Va and the fixed reference voltage. Likewise, the supply-dependent voltage Vr is presented to a first input of a second ADC and a reference voltage (which may be the same as the reference voltage supplied to the first ADC), which is ideally independent of temperature or supply voltage, is supplied to a second input of the second ADC. A second voltage generated by the second ADC will be a digital representation of a relationship between the voltage Vr and the fixed reference voltage. A relationship between the two digital representations of Va and Vr is then generated digitally (e.g., using a processor) in a manner which preserves the cancellation of the supply voltage VDDA in the output signal Vd. Rather than using two separate ADCs, the two (or more) sets of analog signals can be multiplexed at the input of a single ADC (such as through time or phase multiplexing) to generate the two sets of digital representations, as will become apparent to those skilled in the art given the teachings herein.

Figure 6:
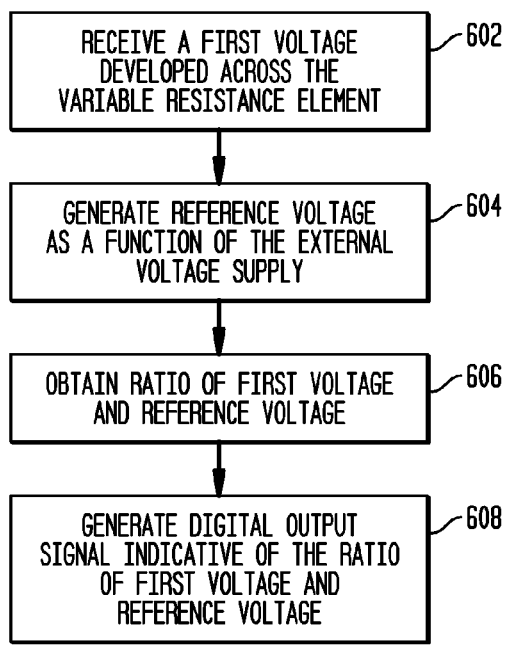
FIG. 6 is a flow diagram depicting an exemplary method for measuring the resistance of a variable resistance element biased with an external voltage supply, according to embodiment of the invention.

FIG. 6 is a flow diagram depicting an exemplary method 600 for measuring the resistance of a variable resistance element (e.g., thermistor or RTD) biased with an external voltage supply, according to embodiment of the invention. The method 600 includes receiving a first voltage developed across the variable resistance element in step 602. In step 604, a reference voltage is generated as a function of the external voltage supply used to bias the variable resistance element. Next, in step 606 a ratio, or other relationship, between the first voltage and the reference voltage is obtained. This ratio may be obtained, for example, using an ADC in the manner stated above in conjunction with the illustrative measurement circuit 500 shown in FIG. 5. In step 608, a digital output signal indicative of the ratio of the first voltage and the reference voltage is generated, a value of the digital output signal being representative of the resistance of a variable resistance element. As previously stated, by utilizing a ratio of the two voltages referenced to the same voltage supply (e.g., VDDA in FIG. 5), variations in the in the first voltage across the variable resistance element attributable to a change in the voltage supply will effectively be eliminated.

It is to be understood that the ordering of steps and/or operations associated with the exemplary method 600 shown herein may be altered while remaining within the intended scope of embodiments of the invention. That is, embodiments of the invention are not limited to performance of the illustrative steps 602 through 608 in the specific order shown.

At least a portion of the techniques of embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which measurement circuits may be employed. Suitable systems for implementing techniques according to embodiments of the invention may include, but are not limited to, reliability and/or performance monitoring circuitry, hard disk drives, data processors, personal computers, etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

The illustrations of embodiments of the invention described herein are intended to provide a general understanding of the architecture of various embodiments of the invention, and they are not intended to serve as a complete description of all the elements and features of apparatus and systems that might make use of the architectures and circuits according to embodiments of the invention described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the inventive subject matter are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A measurement circuit for measuring a resistance of a variable resistance element biased with an external voltage supply, the measurement circuit comprising:
    an analog-to-digital converter operative to receive a reference voltage and a first voltage developed across the variable resistance element, and to generate a digital output signal indicative of a relationship between the first voltage and the reference voltage, wherein a resistance of the variable resistance element varies with temperature, wherein the digital output signal is a binary code indicative of a ratio of the first voltage developed across the variable resistance element and the reference voltage; and
    a reference generator coupled with the analog-to-digital converter and operative to generate the reference voltage as a function of the external voltage supply.

2. The measurement circuit of claim 1, wherein the reference generator comprises a voltage divider circuit adapted for connection with the external voltage supply and operative to generate the reference voltage as a prescribed scale of the external voltage supply.

3. The measurement circuit of claim 2, wherein the voltage divider circuit comprises a final resistor and at least a second resistor, a first terminal of the first resistor being adapted for connection with the external voltage supply, a second terminal of the first resistor being connected with a first terminal of the second resistor and forming an output of the voltage divider circuit, and a second terminal of the second resistor being adapted for connection with the ground.

4. The measurement circuit of claim 1, wherein the reference generator comprises a voltage divider circuit adapted for connection with the external voltage supply and operative to generate a second voltage that is a prescribed scale of the external voltage supply.

5. The measurement circuit of claim 4, wherein the reference generator further comprises a first buffer circuit connected with the voltage divider circuit, the first buffer circuit being adapted to receive the second voltage and to generate the reference voltage as a function of the second voltage.

6. The measurement circuit of claim 5, wherein the first buffer circuit comprises a unity gain amplifier.

7. The measurement circuit of claim 5, further comprising a second buffer circuit connected in series between the variable resistance element and the analog-to-digital converter, the second buffer circuit generating a third voltage that is a function of the voltage across the variable resistance element.

8. The measurement circuit of claim 7, wherein each of the first and second buffer elements comprises an amplifier, a gain of the first amplifier being substantially matched to a gain of the second amplifier.

9. The measurement circuit of claim 7, wherein each of the first and second buffer circuits comprises an amplifier, a gain of the first amplifier being independent of a gain of the second amplifier.

10. The measurement circuit of claim 1, wherein the digital output signal is indicative of a ratio of the first voltage developed across the variable resistance element and the reference voltage.

11. The measurement circuit of claim 1, wherein the variable resistance element comprises at least one of a thermistor and a resistance temperature detector.

12. The measurement circuit of claim 1, wherein the circuit is adapted to measure a temperature of the variable resistance element by translating the digital output signal to a corresponding temperature utilizing a look-up table characterizing a resistance of the variable element over a given temperature range.

13. A method for measuring resistance of a variable resistance element biased with an external voltage supply the method comprising steps of:
receiving a first voltage developed across the variable resistance element, wherein a resistance of the variable resistance element varies with temperature;
generating a reference voltage as a function of the external voltage supply;
providing the first voltage developed across the variable resistance element to a first input of an analog-to digital converter;
providing the reference voltage to a second input of the analog-to-digital converter;
obtaining a relationship between the first voltage and the reference voltage, wherein obtaining the relationship between the first voltage and the reference voltage comprises obtaining a ratio of the first voltage and the reference voltage; and
generating, by the analog-to-digital converter, a digital output signal indicative of the relationship between the first voltage and the reference voltage, a value of the digital output signal being representative of the resistance of the variable resistance element, wherein generating the digital output signal indicative of the relationship between the first voltage and the reference voltage comprises generating the digital output signal that is a binary code indicative of the ratio of the first voltage and the reference voltage.

14. The method of claim 13, wherein a voltage divider circuit is adapted for connection with the external voltage supply, the voltage divider being adapted for generating the reference voltage as a prescribed scale of the external voltage supply.

15. The method of claim 14, wherein a buffer circuit is connected with the voltage divider circuit, the buffer circuit being adapted for generating the reference voltage as a buffered version of a voltage generated by the voltage divider circuit.

16. The method of claim 15, wherein a second buffer circuit is connected in series between the variable resistance element and the analog-to-digital converter, the second buffer circuit generating a third voltage that is a function of the voltage across the variable resistance element, wherein each of the first and second buffer elements comprises an amplifier, a gain of the first amplifier being substantially matched to a gain of the second amplifier.

17. The method of claim 14, further comprising controlling a ratio of the reference voltage relative to the first voltage by adjusting a scale of the reference voltage relative to the external voltage supply.

18. The method of claim 13, further comprising generating a temperature of the variable resistance element by translating the digital output signal to a corresponding temperature utilizing a look-up table characterizing a resistance of the variable resistance element over a given temperature range and by interpolating the digital output signal as a function of the look-up table.

19. An integrated circuit including at least one measurement circuit for measuring a resistance of a variable resistance element biased with an external voltage supply, the at least one measurement circuit comprising:
an analog-to-digital converter operative to receive a reference voltage and a first voltage developed across the variable resistance element, and to generate a digital output signal indicative of a relationship between the first voltage and the reference voltage, wherein a resistance of the variable resistance element varies with temperature, wherein the digital output signal is a binary code indicative of a ratio of the first voltage developed across the variable resistance element and the reference voltage; and
a reference generator coupled with the analog-to-digital converter and operative to generate the reference voltage as a function of the external voltage supply.

20. The integrated circuit of claim 19, wherein the reference generator comprises a voltage divider circuit adapted for connection with the external voltage supply and operative to generate a second voltage that is a prescribed scale of the external voltage supply.

* * * * *